United States Patent
Wang et al.

(10) Patent No.: US 8,563,444 B2
(45) Date of Patent: *Oct. 22, 2013

(54) ALD OF METAL SILICATE FILMS

(75) Inventors: Chang-Gong Wang, Chandler, AZ (US); Eric Shero, Phoenix, AZ (US); Glen Wilk, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/175,204

(22) Filed: Jul. 1, 2011

(65) Prior Publication Data

US 2011/0256735 A1    Oct. 20, 2011

Related U.S. Application Data

(63) Continuation of application No. 11/868,333, filed on Oct. 5, 2007, now Pat. No. 7,972,977.

(60) Provisional application No. 60/850,082, filed on Oct. 5, 2006.

(51) Int. Cl.
    *H01L 21/31* (2006.01)

(52) U.S. Cl.
    USPC ............... 438/785; 438/786; 257/E21.625; 257/E21.639

(58) Field of Classification Search
    USPC ........... 438/786, 785; 257/E21.625, E21.639
    See application file for complete search history.

(56) References Cited

U.S. PATENT DOCUMENTS

| | | | |
|---|---|---|---|
| 3,405,801 A | 10/1968 | Zwiacher et al. |
| 4,058,430 A | 11/1977 | Suntola et al. |
| 4,477,296 A | 10/1984 | Nair |
| 4,486,487 A | 12/1984 | Skarp |
| 4,747,367 A | 5/1988 | Posa |
| 4,761,269 A | 8/1988 | Conger et al. |
| 5,071,670 A | 12/1991 | Kelly |
| 5,294,286 A | 3/1994 | Nishizawa et al. |
| 5,306,666 A | 4/1994 | Izumi |
| 5,320,719 A | 6/1994 | Lasbmore et al. |
| 5,449,314 A | 9/1995 | Meikle et al. |
| 5,453,494 A | 9/1995 | Kirlin et al. |
| 5,610,106 A | 3/1997 | Foster et al. |

(Continued)

FOREIGN PATENT DOCUMENTS

| | | |
|---|---|---|
| EP | 0469470 A1 | 2/1992 |
| EP | 0511264 B2 | 8/1995 |

(Continued)

OTHER PUBLICATIONS

English translation of Korean Office Action, Issued in Korean Patent Application No. 2009-7009189, dated Jun. 27, 2013.

(Continued)

*Primary Examiner* — Jarrett Stark

(74) *Attorney, Agent, or Firm* — Knobbe, Martens, Olson & Bear, LLP

(57) ABSTRACT

Methods for forming metal silicate films are provided. The methods comprise contacting a substrate with alternating and sequential vapor phase pulses of a silicon source chemical, metal source chemical, and an oxidizing agent, wherein the metal source chemical is the next reactant provided after the silicon source chemical. Methods according to some embodiments can be used to form silicon-rich hafnium silicate and zirconium silicate films with substantially uniform film coverages on substrate surface.

15 Claims, 1 Drawing Sheet

(56) References Cited

U.S. PATENT DOCUMENTS

| | | | |
|---|---|---|---|
| 5,625,217 A | 4/1997 | Chau et al. |
| 5,711,811 A | 1/1998 | Suntola et al. |
| 5,731,634 A | 3/1998 | Matsuo et al. |
| 5,769,950 A | 6/1998 | Takasu et al. |
| 5,783,478 A | 7/1998 | Chau et al. |
| 5,795,495 A | 8/1998 | Meikle |
| 5,865,365 A | 2/1999 | Nishikawa et al. |
| 5,916,365 A | 6/1999 | Sherman |
| 5,939,334 A | 8/1999 | Nguyen et al. |
| 6,006,763 A | 12/1999 | Mori et al. |
| 6,033,584 A | 3/2000 | Ngo et al. |
| 6,066,533 A | 5/2000 | Yu |
| 6,066,892 A | 5/2000 | Ding et al. |
| 6,090,666 A | 7/2000 | Ueda et al. |
| 6,124,189 A | 9/2000 | Watanabe et al. |
| 6,130,123 A | 10/2000 | Liang et al. |
| 6,153,935 A | 11/2000 | Edelstein et al. |
| 6,166,417 A | 12/2000 | Bai et al. |
| 6,174,799 B1 | 1/2001 | Lopatin et al. |
| 6,174,809 B1 | 1/2001 | Kang et al. |
| 6,200,893 B1 | 3/2001 | Sneh |
| 6,225,168 B1 | 5/2001 | Gardner et al. |
| 6,265,258 B1 | 7/2001 | Liang et al. |
| 6,291,282 B1 | 9/2001 | Wilk et al. |
| 6,294,836 B1 | 9/2001 | Paranjpe et al. |
| 6,303,500 B1 | 10/2001 | Jiang et al. |
| 6,323,131 B1 | 11/2001 | Obeng et al. |
| 6,329,704 B1 | 12/2001 | Akatsu et al. |
| 6,342,277 B1 | 1/2002 | Sherman |
| 6,346,151 B1 | 2/2002 | Jiang et al. |
| 6,362,526 B1 | 3/2002 | Pramanick et al. |
| 6,365,502 B1 | 4/2002 | Paranjpe et al. |
| 6,368,954 B1 | 4/2002 | Lopatin et al. |
| 6,368,961 B1 | 4/2002 | Lopatin et al. |
| 6,373,111 B1 | 4/2002 | Zheng et al. |
| 6,383,879 B1 | 5/2002 | Kizilyalli et al. |
| 6,399,522 B1 | 6/2002 | Tsan et al. |
| 6,407,435 B1 | 6/2002 | Ma et al. |
| 6,433,432 B2 | 8/2002 | Shimizu |
| 6,444,868 B1 | 9/2002 | Vaughn et al. |
| 6,458,695 B1 | 10/2002 | Lin et al. |
| 6,482,262 B1 | 11/2002 | Elers et al. |
| 6,482,740 B2 | 11/2002 | Soininen et al. |
| 6,506,676 B2 | 1/2003 | Park et al. |
| 6,511,876 B2 | 1/2003 | Buchanan et al. |
| 6,518,106 B2 | 2/2003 | Ngai et al. |
| 6,534,395 B2 | 3/2003 | Werkhoven et al. |
| 6,537,901 B2 | 3/2003 | Cha et al. |
| 6,548,886 B1 | 4/2003 | Ikari et al. |
| 6,579,767 B2 | 6/2003 | Park et al. |
| 6,596,576 B2 | 7/2003 | Fu et al. |
| 6,613,695 B2 | 9/2003 | Pomarede et al. |
| 6,627,503 B2 | 9/2003 | Ma et al. |
| 6,686,271 B2 | 2/2004 | Raaijmakers et al. |
| 6,696,332 B2 | 2/2004 | Visokay et al. |
| 6,700,771 B2 | 3/2004 | Bhattacharyya |
| 6,703,708 B2 | 3/2004 | Werkhoven et al. |
| 6,709,989 B2 | 3/2004 | Ramdani et al. |
| 6,713,846 B1 | 3/2004 | Senzaki |
| 6,714,435 B1 | 3/2004 | Dimmler et al. |
| 6,717,226 B2 | 4/2004 | Hegde et al. |
| 6,723,581 B1 | 4/2004 | Wilk et al. |
| 6,730,163 B2 | 5/2004 | Vaartstra |
| 6,730,588 B1 | 5/2004 | Schinella |
| 6,780,704 B1 | 8/2004 | Raaijmakers et al. |
| 6,800,552 B2 | 10/2004 | Elers et al. |
| 6,815,354 B2 | 11/2004 | Uzoh et al. |
| 6,858,524 B2 | 2/2005 | Haukka et al. |
| 6,933,225 B2 | 8/2005 | Werkhoven et al. |
| 6,955,986 B2 | 10/2005 | Li |
| 6,986,914 B2 | 1/2006 | Elers |
| 7,045,406 B2 | 5/2006 | Huotari et al. |
| 7,053,009 B2 | 5/2006 | Conley, Jr. et al. |
| 7,118,779 B2 | 10/2006 | Verghese et al. |
| 2001/0003064 A1 | 6/2001 | Ohto |
| 2001/0018266 A1 | 8/2001 | Jiang et al. |
| 2001/0025999 A1 | 10/2001 | Suguro |
| 2001/0041250 A1 | 11/2001 | Werkhoven et al. |
| 2001/0052318 A1 | 12/2001 | Jiang et al. |
| 2002/0006468 A1 | 1/2002 | Paranjpe et al. |
| 2002/0008257 A1 | 1/2002 | Barnak et al. |
| 2002/0013487 A1 | 1/2002 | Norman et al. |
| 2002/0014634 A1 | 2/2002 | Koyama et al. |
| 2002/0027286 A1 | 3/2002 | Sundararajan et al. |
| 2002/0030235 A1 | 3/2002 | Agarwal et al. |
| 2002/0037615 A1 | 3/2002 | Matsuo |
| 2002/0096724 A1 | 7/2002 | Liang et al. |
| 2002/0102838 A1 | 8/2002 | Paranjpe et al. |
| 2002/0106536 A1 | 8/2002 | Lee et al. |
| 2002/0137317 A1 | 9/2002 | Kaushik et al. |
| 2002/0190302 A1 | 12/2002 | Bojarczuk et al. |
| 2003/0032281 A1 | 2/2003 | Werkhoven et al. |
| 2003/0049942 A1 | 3/2003 | Haukka et al. |
| 2003/0064607 A1 | 4/2003 | Leu et al. |
| 2003/0072975 A1 | 4/2003 | Shero et al. |
| 2003/0082296 A1 | 5/2003 | Elers et al. |
| 2003/0165615 A1 | 9/2003 | Aaltonen et al. |
| 2003/0201537 A1 | 10/2003 | Lane et al. |
| 2003/0232510 A1 | 12/2003 | Buchanan et al. |
| 2004/0036129 A1 | 2/2004 | Forbes et al. |
| 2004/0071878 A1 | 4/2004 | Schuhmacher |
| 2004/0106261 A1 | 6/2004 | Huotari et al. |
| 2004/0121616 A1 | 6/2004 | Satta et al. |
| 2004/0175928 A1 | 9/2004 | Abell |
| 2005/0009325 A1 | 1/2005 | Chung et al. |
| 2005/0212139 A1 | 9/2005 | Leinikka |
| 2005/0255243 A1 | 11/2005 | Senzaki |
| 2005/0263803 A1 | 12/2005 | Takayanagi |
| 2005/0271812 A1 | 12/2005 | Myo et al. |
| 2005/0271813 A1 * | 12/2005 | Kher et al. ................. 427/248.1 |
| 2006/0046384 A1 | 3/2006 | Joo et al. |
| 2006/0078679 A1 | 4/2006 | Elers et al. |
| 2006/0121733 A1 | 6/2006 | Kilpela et al. |
| 2006/0216932 A1 | 9/2006 | Kumar et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0148347 A1 | 6/2007 | Hatanpaa et al. |

FOREIGN PATENT DOCUMENTS

| | | |
|---|---|---|
| EP | 0854 505 A2 | 7/1998 |
| EP | 0880168 A2 | 11/1998 |
| EP | 1063687 | 12/2000 |
| GB | 2372042 | 8/2002 |
| GB | 2372043 | 8/2002 |
| GB | 2372044 | 8/2002 |
| JP | 2006-054382 | 2/2006 |
| WO | WO 93/10652 | 5/1993 |
| WO | WO 94/14198 | 6/1994 |
| WO | WO 00/03420 | 1/2000 |
| WO | WO 00/47404 | 8/2000 |
| WO | WO 00/47796 | 8/2000 |
| WO | WO 00/54320 | 9/2000 |
| WO | WO 00/61833 | 10/2000 |
| WO | WO 01/29280 A1 | 4/2001 |
| WO | WO 01/29892 A1 | 4/2001 |
| WO | WO 01/29893 A1 | 4/2001 |
| WO | WO 01/40541 A1 | 7/2001 |
| WO | WO 01/66832 A2 | 9/2001 |
| WO | WO 01/99166 | 12/2001 |
| WO | WO 02/43115 A2 | 5/2002 |
| WO | WO 02/50922 A1 | 6/2002 |
| WO | WO 2004/064147 A | 7/2004 |
| WO | WO 2004/114398 A | 12/2004 |
| WO | WO 2005/113852 | 12/2005 |
| WO | WO 2005/113855 | 12/2005 |
| WO | WO 2005/117086 | 12/2005 |
| WO | WO 2007/043709 | 4/2007 |
| WO | WO 2008/011235 | 1/2008 |

(56) References Cited

OTHER PUBLICATIONS

English translation of Japanese Office Action, issued in Japanese
Patent Application No. 2009531590, dated Jun. 4, 2013.
1988RD-0296076, "Field effect transistor structure with improved transconductance—contg. Spacer-less conducting gate oxide, and tungsten deposition on source and drain," Anonymous.
Aaltonen et al., "Atomic Layer Deposition of Noble Metal Thin Films," dissertation presented at the University of Helsinki, Helsinki, Finland, 2005.
Aaltonen et al., "Atomic Layer Deposition of Platinum Thin Films," *Chem. Mater*. 15:1924-1928 (2003).
Abeles, et al., Amorphous Semiconductor Superlattices, Physical Review Letters, Vo. 51, No. 21, pp. 2003-2006.
Alén et al., "ALD of Ta(Si)N Thin Films Using TDMAS as a Reducing Agent and as a Si Precursor," *J. Electrochem. Soc.*. 151(8): G523-G527 (2004).
Alén, "Atomic Layer Deposition of TaN, NbN, and MoN Films for Cu Metallizations", Academic Dissertation, Jun. 22, 2005, Helsinki, Finland.
Atomic Layer Deposition Targets Thin Films, Wafer Processing, Semiconductor International, Sep. 1999.
Bai, High K Gate Stack for Sub-0.1 UM CMOS Technology, Electrochemical Society Proceedings, vol. 99-100, pp. 39-44 (1999).
Baliga, J., "New Designs and Materials Tackle 1 Gb Memory Challenge, " Semiconductor International, World Wide Web address: semiconductor.net, Nov. 2000.
Basceri, C., "Electrial Dielectric Properties of (Ba,Sr) $TiO_3$ Thin Film Capacitors for Ultra-High Density Dynamic Random Access Memories", Thesis, 1997.
Chatterjee et al., "CMOS Metal Replacement Gate Transistors using Tantalum Pentoxide Gate Insulator," IEEE, IEDM, 0/7803-4774-9/98, pp. 777-780 (1998).
Chen et al., "0.18μm Metal Gate Fully-Depleted SOI MOSFETs for Advanced CMOS Applications," Symposium on VLSI Technology Digest of Technical Papers, pp. 25-26 (1999).
Del Prado, et al., "Full composition range silicon oxynitride films deposited by ECR-PECVD at room temperature," Thin Solid Films, vol. 344, pp. 437-440 (1999).
Delabie A, et al."Atomic Layer Deposition of hafnium silicate gate dielectric layers", Journal of Vacuum Science & Technology A (Vacuum, Surfaces, and Films) AIP for American Vacuum SOC. USA, vol. 25, No. 4, Jul. 2007, pp. 1302-1308, XP002472774 ISSN: 0734-2101, p. 1302, right-hand col., last paragraph-p. 1303, left-hand col., paragraph 1, p. 1304, left-hand col., last paragraph—right-hand col., paragraph 1.
Desu, et al, Enhanced Dielectric Properties of Modified $Ta_2O_5$ Thin Films, Mat Res. Innovat (1999) 2:299-302.
Ducroquet et al., "Full CMP Integration of CVD TiN Damascene Sub-0.1-μm Metal Gate Devices for ULSI Applications," IEEE Transactions on Electron Devices 48(8): 1816-1821 (2001).
Duenas et al, "Experimental investigation of the electrical properties of atomic layer deposited hafnium-rich silicate films on n-type silicon", Journal of Applied Physics, American Institute of Physics, New York, US, vol. 100, No. 9, Nov. 10, 2006, pp. 94107-1-94107-9, XP012090464 ISSN; 0021-8979, pp. 94107-2, right-hand col., paragraph 3.
Elam et al., "Surface Chemistry and Film Growth During TiN Atomic Layer Deposition Using TDMAT and $NH_3$," *Thin Solid Films* (436):145-156 (2003).
Fedorenko Y et al. "Atomic layer deposition of hafnium silicate from HfC14, SiC14, and H2O", Electrochemical and Solid-State Letters Electrochem, Soc Usa, vol. 10, No. 5, May 5, 2007, pp. H149-H152, XP002472773 ISSN; 1099-0062, p. H149, left-hand col., paragraph 3-right-hand col. paragraph 1 p. H150, right-hand col., last paragraph—p. H151, left-hand col., paragraph 1.
Ferguson et al., "Titanium Nitride Metal Gate Electrode: Effect of Nitrogen Incorporation," Advanced Metallization Conference 2001 (AMC 2001), pp. 115-119.
Ferguson, et al., "Atomic Layer Deposition of Boron Nitride Using a Sequential Exposures of $BCl_3$ and $NH_3$," *Thin Solid Films* (413): 16-24 (2002).

Haukka and Root, "The Reaction of Hexamethyldisilazane and Subsequent Oxidation of Trimethylsilyl Groups on Silica Studied by Solid-State NMR and FTIR," *J. Phys. Chem*. 98:1695-1703 (1994).
Hiltunen et al., "Nitrides of Titanium, Niobium, Tantalum and Molybdenum Grown as Thin Films by the Atomic Layer Epitaxy Method," *Thin Solid Films* 166: 149-154 (1988).
Hobbs et al., "Sub-Quarter Micron CMOS Process for TiN-Gate MOSFETs with $TiO_2$ Gate Dielectric formed by Titanium Oxidation," Advanced Products Research and Development Lab, Symposium on VLSI Technology Digest of Technical Papers, pp. 133-134 (1999).
Hoyas et al. Growth and Characterization of Atomic Layer Deposited WCO.7NO.3 on Polymer Films,' Journal of Applied Physics, Jan. 1, 2004, 95(1):381-388.
Ihanus, et al, ALE Growth of ZnS.sub.1-x Se.sub.x Thin Films by Substrating Surface Sulfur with Elemental Selenium, Applied Surface Science 112 (1997) 154-158.
International Preliminary Examination Report, PCT/US01/06746.
International Search Report PCT/US2007/080342.
International Search Report, PCT/US2006/005868.
Kaizuka, et al., Conformal Chemical Vapor Deposition TiN (111) Film Formation as an Underlayer of Al for Highly Reliable Interconnects, jpn. J. Appl. Phys. vol. 33 (1994) pp. 470-474.
Kikkawa, et al., A Quarter-Micrometer Interconnection Technology Using a TiN/Al-Si-Cu/TiN/Al-Si-Cu/TiN/Ti Multilayer Structure, IEEE Transactions on Electron Devices, vol. 40, No. 2 Feb. 1993.
Kikkawa, et al., Al-Si-Cu/TiN Multilayer Interconnection and Al-Ge Reflow Sputtering Technologies for Quarter-Micron Devices, 54/SPIE vol. 1805 Submicrometer Metallization (1992).
Kim, et al., The Effects of Substrate and Annealing Ambient on the Electrical Properties of $Ta_2O_5$ Thin Films Prepared by Plasma Enhanced Chemical Vapor Deposition, Thin Film Solids 253 (1994) pp. 453-439.
Klaus et al., "Atomic Layer Controlled Growth of $Si_3N_4$ Films Using Sequential Surface Reactions," *Surf. Sci*. (418): L14-L19 (1998).
Klaus et al., "Atomic layer deposition of tungsten using sequential surface chemistry with a sacrificial stripping reaction," *Thin Solid Films* 360, 145-153 (2000).
Koh et al. "Meeting the Cu diffusion barrier challenge using ALD tungsten nitride carbide," *Solid State Technology*, 54-58 (Jun. 2005).
Kukli K et al. "Hafnium silicon oxide films prepared by atomic layer deposition" Materials Science and Engineering B, Elsevier Sequoia, Lausanne, CH , vol. 109, No. 1-3, Jun. 15, 2004, pp. 2-5, XP004507161 ISSN: 0921-5107 p. 2, right-hand col., paragraph 2.1 p. 3; table 1.
Kukli K et al. "Properties of Oxide Film Atomic Layer Deposited from Tetraethoxy Silane, Hafnium Halides, and Water" Journal of the Electrochemical Society, vol. 151, No. 5, Mar. 17, 2004, p. F98-F104, XP002472772 p. F99, left-hand col., paragraphs 3, 4; tables I, II p. F100, left-hand column, paragraphs 3,4; tale III p. F1011 table IV.
Kukli, et al., Properties of Oxide Film Atomic Layer Deposited from Tetraethoxy Silane, Hafnium Halides, and Water, J. Electochem. Soc. vol. 151, No. 5, Mar. 17, 2004, pp. F98-F104, XP002472772.
Kwon et al., "Ruthenium Bottom Electrode Prepared by Electroplating for a High Density DRAM Capacitor," J. Electrochem. Soc. 151(2): C127-C132 (2004).
Lai et al., "Precursors for Organometallic Chemical Vapor Deposition of Tungsten Carbide Films," *Chem. Mater*, 7, 2284-2292 (1995).
Leskela, et al., Atomic Layer Epitaxy in Deposition of Various Oxide and Nitride Thin Films, Journal De Physique IV, Colloque C5, Supplement au Journal de Physique II, vol. 5, Jun. 1995.
Lin et al., "An Adjustable Work Function Technology Using Mo Gate for CMOS Devices," *IEEE Electron Dev. Lett*. 23(1): 49-51 (2002).
Liu et al., "Metal Nanocrystal Memories—Part I: Device Design and Fabrication," *IEEE Transactions on Electron Devices* 49(9): 1606-1613 (2002).
Liu et al., "Metal Nanocrystal Memories—Part II: Electrical Characteristics," *IEEE Transactions on Electron Devices* 49(9): 1614-1622 (2002).
Lu et al., "Metal Gate Work Function Adjustment for Future Cmos Technology," Symp. VLSI Technology Digest of Technical Papers, pp. 45-46 (2001).

(56) References Cited

OTHER PUBLICATIONS

Lucovsky, "Integration of Alternative High-K Gate Dielectrics into Aggressively Scaled CMOS Si Devices: Chemical Bonding Constraints at Si-Dielectric Interfaces," Electrochemical Society Proceedings, vol. 99-10, pp. 69-80 (1999).

Maiti et al., "PVD TiN Metal Gate MOSFETs on Bulk Silicon and Fully Depleted Silicon-On-Insulator (FDSOI) Substrates for Deep Sub-Quarter Micron CMOS Technology," IEEE, IEDM, 0/7803-47749/98, pp. 781-784 (1998).

Martensson, et al., Use of Atomic Layer Epitaxy for Fabrication of Si/TiN/Cu Structures, J.Vac Sci. Technol.B 17(5), Sep./Oct. 1999, pp. 2122-2128.

Michaelson, H. B., "The Work Function of the Elements and its Periodicity," *J. Appl. Phys*. 48(11): 4729-4733 (1977).

Min et al., "The Mechanism of Si Incorporation and the Digital Control of Si Content during the Metallorganic Atomic Layer Deposition of Ti-Si-N. Thin Films," *J. Electrochem. Soc*. 147(10): 3868-3872 (2000).

Min, et al., Atomic Layer Deposition of TiN Films by Alternate Supply of Tetrakis (ethylmethylamino)-Titatium and Ammonia, Jpn. J. Appl. Phys. vol. 37 (1998) pp. 4999-5004.

Min, et al., Atomic Layer Deposition of TiN Thin Films by Sequential Introduction of Ti precursor and $NH_3$. Mat. Res. Soc. Symp. Proc. vol. 514 1996 Materials Research Society.

Nakajima et al. "Chemical Vapor Deposition of Tungsten Carbide, Molybdenum Carbide Nitride, and Molybdenum Nitride Films," *J. Electrochem. Soc*., vol. 144, No. 6 (Jun. 1997).

Nakajima, et al., "Atomic-layer-deposited silicon-nitride/$SiO_2$ stacked gate dielectrics for highly reliable p-metal-oxide-semiconductor filed-effect transistors," Applied Physics Letters, vol. 77, No. 18, pp. 2855-2857 (2000).

Nakajima, et al., "Low-temperature formation of silicon nitride gate dielectrics by atomic-layer deposition," Applied Physics Letters, vol. 79, No. 5, pp. 665-667 (2001).

Niinisto et al., Synthesis of Oxide Thin Films and Overlayers by Atomic Layer Epitaxy for Advanced Applications, Materials Science and Engineering B41 (1996) 23-29.

Park et al., "Robust Ternary Metal Gate Electrodes for Dual Gate CMOS Devices," IEEE, IEDM, 0-7803-7050-3/02, pp. 671-674 (2001).

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

Patent Abstracts of Japan Publication No. JP 2000-058777 Dated Feb. 25, 2000 (English Abstract).

Polishchuk, "Dual Work Function Metal Gate CMOS Technology Using Metal Interdiffusion," *IEEE Electron Device Letters* 22(9): 444-446 (2001).

Ritala et al., "Controlled Growth of TaN, $Ta_3N_5$, and $TaO_xN_y$, Thin Films by Atomic Layer Deposition," *J. Chem. Mater*. 11: 1712-1718 (1999).

Ritala, et al, Perfectly Conformal TiN and $Al_2O_3$ Films Deposited by Atomic Layer Deposition, Communications, Chemical Vapor Deposition 1999, 5, No. 1, pp. 7-9.

Ritala, et al., Atomic Layer Epitaxy Growth of tiN Thin Films from $TiI_4$ and $NH_3$, J. Electrochemical Soc., vol. 145, No. 8, Aug. 1998 pp. 2914-2920.

Ritala, et al., Zirconium Dioxide Thin Films Deposited by ALE Using Zirconium Tetrachloride as Precursor, Applied Surface Science, 75 (1994) pp. 333-340.

Sakaue, et al., Digital Chemical Vapor Deposition of $SiO_2$ Using a Repetitive Reaction of TriethylsilanelHydrogen and Oxidation, Japanese Journal of Applied Physics, vol. 30, No. 1B, Jan. 1990, pp. L124-L127.

Schumacher et al., "Integration of ALD WCN Into a Dual Damascene Oxide Module.".

Singer, Atomic Layer Deposition Targets Thin Films, Semiconductor International, Sep. 1, 1999, 1 page.

Sneh, et al., Atomic Layer Growth of $SiO_2$ on Si(100) Using $SiCl_4$ and $H_2$O in a Binary Reaction Sequence, Surface Science 334 (1995) 135-152.

SOI Technology: IBM's Next Advance in Chip Design, 1998.

Suntola, "Atomic Layer Epitaxy," *Handbook of Crystal Growth, vol. 3*, chapter 14, pp. 601-663 (1994).

Tiita, et al. , Phosphorus-Doped Alumina, vol. 33, No. 9 pp. 1319-1323.

Tiita, et al., Preparation and Characterization of Phosphorus-Doped Aluminum Oxide Thin Films, Materials Research Bulletin, vol. 33, No. 9 pp. 1315-1323 1998.

Vehkamaki, et al., Growth of $SrTiO_3$ and $BaTiO_3$ Thin Films by Atomic Layer Deposition, Department of Chemistry. University of Helsinki. FIN-00014. Helsinki, Finland, Electronic and Solid State Letters, 2 (10) (1999) Letters Online.

Wakabayashi et al., "A Novel W/TiNx Metal Gate CMOS Technology using Nitrogren-Concentration-Controlling TiNx Film," IEEE, IEDM, 0/7803-5410-9/99, pp. 253-256 (1999).

Wilk et al., "High-k dielectrics: Current status and materials properties considerations," *Journal of Applied Physics* 89(10): 5243-5275 (2001).

Wise et al, Diethyldiethoxysilane as a New Precursor for $SiO_2$ Growth of Silicon, Mat. Res. Soc. Symp. Proc. vol. 334, pp. 37-43.

Yagishita et al., "High Performance Damascene Metal Gate MOSFET's for 0.1 μm Regime," *IEEE Transactions on Electron Devices* 47(5): 1028-1034 (2000).

Yagishita et al., "Reduction of Threshold Voltage Deviation in Damascene Metal Gate MOSFETs," IEEE, IEDM, 0/7083-5410-9/99, pp. 257-260 (1999).

Yeo et al., "Dual-Metal Gate CMOS Technology with Ultrathin Silicon Nitride Gate Dielectric," *IEEE Electronic Device Letters* 22(5): 227-229 (2001).

Zhong et al., "Characterization of $RuO_2$ Electrodes on Zr Silicate and $ZrO_2$ Dielectrics," *Appl Phys. Lett*. 78(8): 1134-1136 (2001).

Zhong et al., "Electrical Properties of $RuO_2$ Gate Electrodes for Dual Metal Gate Si-CMOS," *IEEE Electron Device Letters* 21(12): pp. 593-595 (2000).

English translation of Taiwan Office Action, issued in Taiwan Patent Application No. 096137237, dated Feb. 18, 2013.

* cited by examiner

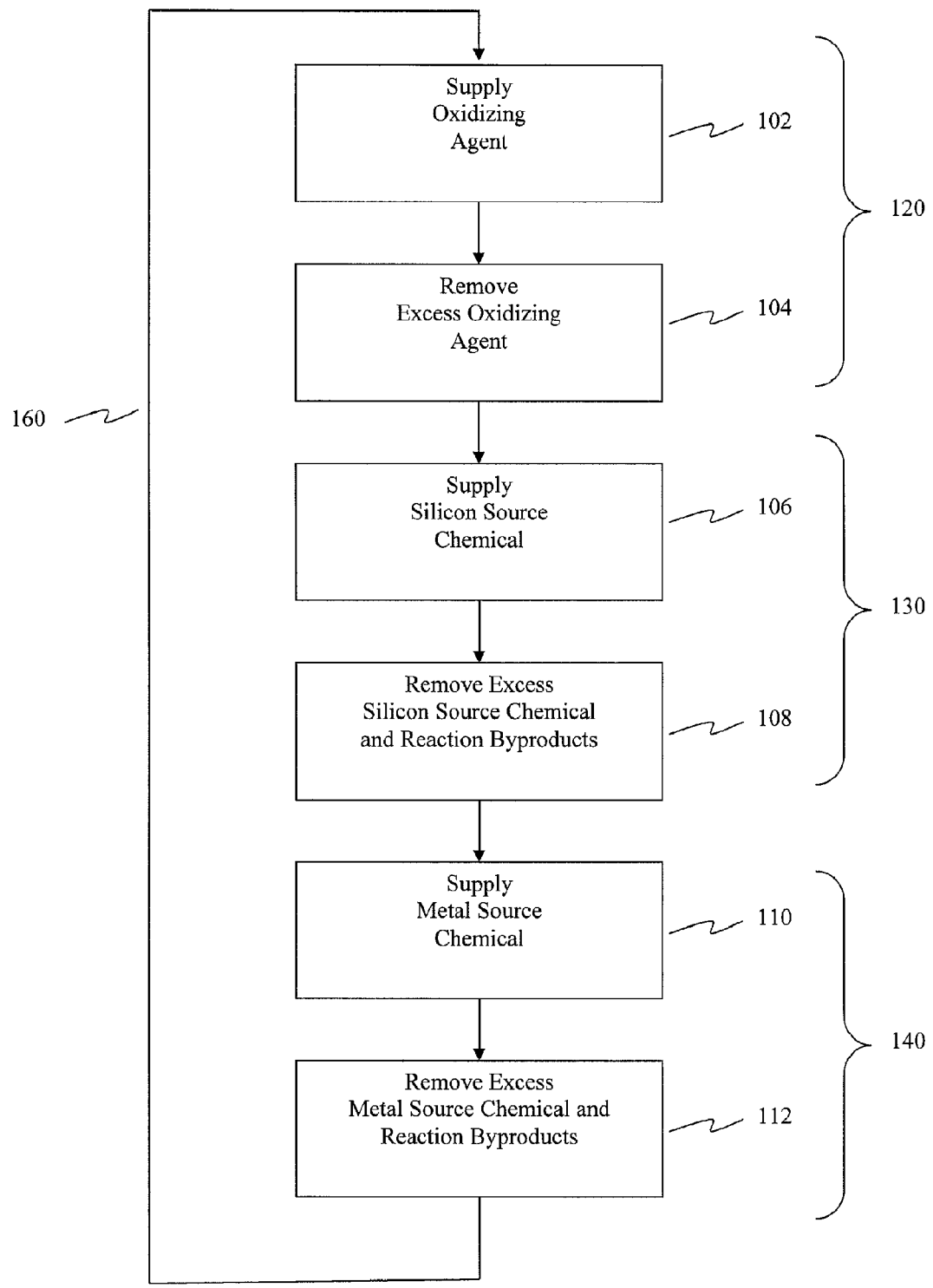

ALD OF METAL SILICATE FILMS

REFERENCE TO RELATED APPLICATIONS

The present application is a continuation of U.S. application Ser. No. 11/868,333 filed Oct. 5, 2007 and issued as U.S. Pat. No. 7,972,977, which claims priority to U.S. Provisional Patent Application No. 60/850,082, filed Oct. 5, 2006. The entirety of each of the priority applications is hereby incorporated by reference in its entirety.

BACKGROUND

1. Field of the Disclosure

The present disclosure relates to metal silicate films. In particular, the disclosure concerns methods for forming silicon-rich metal silicate films by atomic layer deposition (ALD) and the films formed by such methods.

2. Description of the Related Art

The integration level of components in integrated circuits is increasing, which rapidly places a demand for a decrease of the size of integrated circuit (IC) components and interconnects. Design rules are setting the feature sizes to ≤0.2 µm, making complete film coverage on deep bottoms and vias difficult to obtain using traditional methods. Additionally, with decreasing feature sizes, quantum mechanical tunneling ("tunneling") leads to leakage current, i.e., current leaking out of device features (e.g., across gate oxides), which adversely affects device performance. For this reason, substantially thin $SiO_2$ films are unreliable as gate dielectrics (gate oxides), for example, in MOSFET (metal-oxide-semiconductor field-effect transistor) devices. Thus, a dielectric material with a high dielectric constant ("high-k dielectric") is desirable.

At least some high-k dielectric materials can be deposited on silicon surfaces and remain stable under thermal annealing processes. In gate dielectric applications, electrically active defects should be minimized or prevented from forming at interfaces between silicon wafers and high-k dielectrics. In memory applications, such as in dynamic random access memory (DRAM) applications, the structure of the dielectric can be substantially stable under high activation temperatures. It has been found that mixing silicon oxide ($SiO_x$, where 'x'=1 or 2) with a metal oxide forms stable metal silicates that can be used as high-k dielectrics with desirable properties.

Hafnium silicate ($HfSiO_x$) and Zirconium silicate ($ZrSiO_x$) have been used to replace silicon oxide in some applications, such as complementary metal oxide semiconductor (CMOS) applications, because they can offer excellent thermal stability and device performance in integrated circuits with device features sizes of about 65 nanometers (nm) or less. However, with decreasing features sizes, it has become increasingly difficult to deposit hafnium silicate films with compositional and thickness uniformities suited for current and future generation of ICs.

Metal silicate films are conventionally deposited by first contacting a substrate surface with water to form initial OH surface terminations, followed by contacting the substrate with a pulse of a metal source chemical (e.g., $HfCl_4$) to form a metallic film on the substrate, the metallic film comprising metals with halogen ligands (e.g., Si—O—$HfCl_3$). Subsequently contacting the metals with water replaces the halogen ligands with OH ligands. Next, a silicon source chemical (e.g., $SiCl_4$) is contacted with the OH terminated metals to form halogen terminated silicon atoms covalently bonded to the metals (e.g., Si—O—Hf—O—$SiCl_3$). Subsequent exposure to water replaces the halogen ligands with OH groups (e.g., Si—O—Hf—O—$Si(OH)_3$). This process can be repeated to form a metal silicate film. With decreasing device dimensions, metal silicate films with high dielectric constants are desirable because they will minimize quantum mechanical tunneling across the dielectric. Metal silicate films with increased silicon content are desirable because they have excellent thermal stability and good interface properties. However, a limitation of the conventional processes described above is that the maximum silicon content achievable is about 65%, rendering the method unsuitable for applications in which metal silicate films with a silicon content greater than 65% are desired.

SUMMARY

In one aspect, atomic layer deposition (ALD) methods for forming a metal silicate film are provided. The methods can include contacting a substrate in a reaction space with spatially and temporally separated vapor phase pulses of a silicon source chemical, a metal source chemical and an oxidizing agent, wherein the metal source chemical is the next reactant provided after the silicon source chemical. The metal silicate film may be a silicon-rich film. In some embodiments the metal source chemical is $HfCl_4$, the silicon source chemical is $SiCl_4$ and the oxidizing agent is $H_2O$.

In some embodiments, metal silicate films are deposited by an ALD process comprising (a) contacting the substrate with a vapor phase pulse of a silicon source chemical; (b) removing excess silicon source chemical and reaction by-products, if any, from the reaction space; (c) contacting the substrate with a vapor phase pulse of a metal source chemical; (d) removing excess metal source chemical; (e) contacting the substrate with a vapor phase pulse of an oxidizing agent; (f) removing excess oxidizing agent and reaction by-products, if any, from the reaction space; and (g) repeating steps (a) through (f) until a metal silicate film of predetermined thickness if formed on the substrate. The ALD process may begin with step (a). However, in some embodiments, the process may begin with a different step, such as step (c) or step (e). In some embodiments, the metal source chemical is the next reactant provided after the silicon source chemical. In some embodiments, step (a) and step (c) can be merged into one step where silicon source chemical and metal source chemical are introduced into the reaction space simultaneously. In addition, the substrate surface may be treated prior to beginning the first ALD cycle to provide an appropriate termination. For example the substrate may be terminated with OH groups, prior to beginning the ALD process.

In some embodiments a silicon-rich film is deposited by alternately contacting the substrate with a silicon source chemical such as $SiCl_4$ and an oxidizing agent, such as, for example, water, a number of times after step (f) and prior to beginning the primary ALD cycle again.

In another aspect, a silicon-rich metal silicate film is provided. In some embodiments, the silicon-rich metal silicon film has a silicon content greater than about 65%, greater than about 75%, or greater than about 80%.

All of these aspects are intended to be within the scope of the invention herein disclosed. Other embodiments of the present invention will be readily apparent to those skilled in the art from the following detailed description of some embodiments and reference to the attached FIGURE, the invention not being limited to any of the particular embodiments disclosed.

BRIEF DESCRIPTION OF THE DRAWINGS

The invention will be better understood from the Detailed Description and from the appended drawing, which is meant to illustrate and not to limit the invention.

FIG. 1 is a block diagram of a pulsing sequence according to an embodiment.

DETAILED DESCRIPTION

In conventional methods of depositing metal oxide films by atomic layer deposition (ALD), cycles depositing films of silicon oxide and metal oxide are alternated. The stoichiometry is controlled, as much as possible, by adjusting the ratio of cycles depositing the metal oxide, such as hafnium oxide, to cycles depositing silicon oxide. However, the commonly used silicon halide precursors are only able to initiate further $SiO_2$ growth under very high precursor partial pressure or with lengthy exposure. As a result, there is a limit to the amount of silicon that can be incorporated in the silicate film under commercially viable reaction conditions, even when the ratio of silicon oxide deposition cycles to metal oxide deposition cycles is high. In particular, under typical reaction conditions silicon incorporation saturates at around 65% because of the inability to grow additional layers of silicon oxide upon itself in a production-worthy time scale. While longer exposure to silicon halide precursors can be used to incorporate more silicon into the metal silicate film, the required exposure time slows down the process and reduces throughput to an unacceptable level. In order to avoid this problem, the art has generally looked to other more reactive precursors such as organic silicon precursors. However, there are a number of problems associated with the use of such precursors, including carbon contamination and degraded electrical properties.

The methods described herein enable formation of silicon-rich metal silicon films by limiting the amount of Hf incorporated into the growing film in each cycle, thus allowing for the incorporation of more silicon. This can be accomplished by providing the metal precursor pulse as the next reactant following the silicon precursor pulse in each ALD cycle. In some embodiments, the methods enable formation of a metal silicate film with a silicon content greater than 65%, greater than or equal to 75%, or greater than or equal to 80%. Although described primarily in terms of deposition of silicate films containing hafnium, the skilled artisan will recognize that the methods described herein can be applied to the formation of silicate films comprising other metals.

As used herein, "an ALD process" generally refers to a process for producing thin films over a substrate molecular layer by molecular layer using self-saturating chemical reactions. The general principles of ALD are disclosed, e.g., in U.S. Pat. Nos. 4,058,430 and 5,711,811, and Suntola, e.g., in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the entire disclosures of which are incorporated herein by reference. In a typical ALD process, gaseous reactants are conducted separately (usually alternately and sequentially) into a reaction space of an ALD type reactor where they contact a substrate located in the space to provide a surface reaction. The pressure and the temperature of the reaction space are adjusted to a range where physisorption (i.e., condensation of gases) and thermal decomposition of the precursors are avoided. In addition, reactants that do not react with themselves are selected. Consequently, only up to one monolayer (i.e., an atomic layer or a molecular layer) of material is deposited at a time during each pulsing cycle. The actual growth rate of the thin film, which is typically presented as Å/pulsing cycle, depends, for example, on the number of available reactive surface sites and the bulkiness of the reactant molecules. That is, once all available binding sites are filled, no additional surface reactions are possible. Gas phase reactions between precursors and any undesired reaction by-products are inhibited because reactant pulses are separated from each other by time and/or space. The reaction space is typically purged with an inert gas (e.g., $N_2$, Ar, He, or $H_2$) and/or evacuated, e.g., using a vacuum pump, between reactant pulses to remove excess gaseous reactants and reaction by-products, if any.

A reaction space can include a volume in a reactor in which conditions can be adjusted to effect film growth by ALD processes. The reaction space can include surfaces subject to all reaction gas pulses from which gases or particles can flow to the substrate, by entrained flow or diffusion, during normal operation. The reaction space can be, for example, the reaction chamber in a single-wafer ALD reactor or the reaction chamber of a batch ALD reactor, where deposition on multiple substrates takes place at the same time. In addition, chemical vapor deposition (CVD) reactors can be adapted for use in the methods. The reactor can be configured for plasma generation, either in situ or remote. An example reactor is the Pulsar™ reactor available from ASM America (Phoenix, Ariz.).

A metal silicate film is a film that includes silicon, one or more metals (other than silicon) and oxygen. A metal silicate film can be generally denoted by $M_xSi_yO_z$, wherein "M" designates one or more metals and "x", "y" and "z" are numbers greater than zero. A metal silicate film can be formed by depositing tiered and alternating layers of silicon oxide (e.g., SiO, $SiO_2$) and a metal oxide. As an example, a hafnium silicate film may be formed from alternating layers of $HfO_2$ and $SiO_2$. A silicon-rich metal silicate film can be formed by depositing tiered layers, wherein each layer may comprise a metal oxide and a silicon oxide (also referred to herein as a "mixed layer"). Metal silicate films with increased silicon content can be deposited directly on a silicon surface to achieve desirable electrical properties.

Silicon content in a film can be determined by dividing the total number of silicon atoms in a metal silicon film by the total number of silicon and metal atoms, i.e., Si/(Si+metal). Accordingly, the silicon content is average across a metal silicate film.

The methods presented herein allow controlled deposition of a conformal metal silicate films, such as, for example, silicon-rich metal silicate films, on a substrate surface. The substrate is a workpiece on which deposition is desired and can include silicon, silica, coated silicon, copper metal, dielectric materials, nitride, and/or combinations of materials. The substrate surface is a boundary between the reaction space and a feature of the substrate. Geometrically challenging applications, such as deposition in high aspect-ratio features (e.g., vias and trenches), are possible due to the self-limiting nature of the surface reactions using the chemistries provided herein.

According to some embodiments, ALD is used to form silicon-rich metal silicate films over a substrate, such as an integrated circuit (IC) workpiece. The substrate or workpiece is placed in a reaction space and subjected to alternately repeated surface reactions of a silicon source chemical, a metal source chemical and an oxidizing agent, where the metal source chemical is the next reactant provided after the silicon source chemical. Some ALD methods are "thermal" ALD processes, in which the substrate is heated during deposition. Alternatively, in some embodiments, plasma-enhanced ALD processes may be used.

In some embodiments, each ALD cycle comprises at least three deposition steps or phases and utilizes at least three different reactants. Although referred to as "the first," the second," and "the third" reactant, these designations do not imply that the reactants have to be introduced in this order. Thus, in some embodiments, an ALD cycle may start with the third reactant. Similarly, although referred to as first, second and third phases, they are not necessarily carried out in this sequence. For example, in some cases, deposition may start with the third phase. Additionally, each of the phases may be repeated prior to a subsequent phase. Additional phases, such as a silicon deposition phase, may also be incorporated into the overall ALD process.

In some embodiments, the first reactant (also referred to as "silicon reactant" herein) is a vapor phase silicon source chemical (also referred to as "silicon source material" or "silicon halide source chemical" herein) and will react with a substrate surface in a self-limiting manner to form no more than about one monolayer of silicon, provided that the substrate surface comprises the appropriate termination and/or bonding configuration.

In some embodiments, the silicon source chemical is a silicon halide compound, such as, e.g., $Si_xW_yH_z$, wherein "W" is a halide selected from the group consisting of F, Cl, Br and I, "x" and "y" are integers greater than zero, and "z" is an integer greater than or equal to zero. The silicon halide source chemical may be selected from the group consisting of silicon fluorides (e.g., $SiF_4$), silicon chlorides (e.g., $SiCl_4$), silicon bromides (e.g., $SiBr_4$), and silicon iodides (e.g., $SiF_4$). In some embodiments, the silicon halide compound is silicon tetrachloride ($SiCl_4$).

The second reactant (also referred to as a "metal reactant" herein) is a metal source chemical and will react with unoccupied binding sites on the substrate surface. These unoccupied sites are generally sites that are not able to react with a previous silicon source chemical pulse, for example because of thermodynamic or kinetic considerations. No more than about one monolayer of a metal (or a plurality of metals if a source chemical comprising a plurality of metals is used, or if a plurality of metal source chemicals are used) is adsorbed on the substrate surface. Adsorption can include forming a chemical bond to the surface, or chemisoprtion or forming a weakly-bound condensed phase on the surface, or physisorption. The metal reactant can include a transition metal species desired in the metal silicate film being deposited. In particular embodiments, the metal reactant is a vapor phase species comprising one or both of hafnium (Hf) and zirconium (Zr).

The metal reactant is typically selected based on reactivity, vapor pressure and compatibility with the silicon reactant. In some embodiments, the metal reactant is a metal halide source chemical. In some embodiments, the metal reactant is $MX_4$, wherein "M" is a metal, such as, e.g., Hf or Zr, and X is selected from the group consisting of F, Cl, Br and I. An example reactant is $HfCl_4$.

The third reactant (also referred to as an "oxidizing agent" or "OH-contributing agent" herein) comprises oxygen and, in some embodiments, comprises an OH group. In some embodiments, the oxidizing agent is capable of contributing OH groups to silicon and/or metal on the substrate surface. The oxidizing agent is typically a vapor phase species of, for example, water ($H_2O$), hydrogen peroxide ($H_2O_2$), $O_2$, $O_3$, $D_2O$, $D_2O_2$, $N_2O$, NO, $N_2O_5$, and plasma-activated species of oxygen. The oxidizing agent can also be an alcohol, such as, for example, isopropyl alcohol, methanol, ethanol, a small molecular weight alcohol, or another suitable organic compound having a hydroxyl group. In some embodiments, the oxidizing agent is an $NO_x$-type of neutral species or oxygen-containing radicals. In some embodiments, the oxidizing agent reacts with silicon and/or a metal on a substrate surface to form a silicon/metal hydroxide.

It will be appreciated that prior to deposition of a metal silicate film, the substrate may be provided with an initial surface termination. As an example, a silicon substrate may be contacted with water to form an OH surface termination on the silicon. The surface termination may, for example, make the surface reactive with one of the metal or silicon reactants.

In one phase of the ALD cycle, herein referred to as "the first phase," after initial surface termination, if desired, a pulse of the silicon reactant (i.e., silicon source chemical) is supplied to the reaction space. The amount of silicon source chemical that can adsorb on the surface is determined at least in part by the number of available binding sites on the surface and by steric constraints. The silicon reactant will react with —OH terminated surface sites on the substrate surface, if the energy barrier for the ligand exchange reaction can be overcome under the reaction conditions. However, at the deposition temperature and with a practical and commercially viable pulse duration, the silicon reactant will not react with all —OH terminated sites on the substrate surface due to the thermodynamic and kinetic considerations. As a result, there will still be unoccupied surface groups with specific bonding structure.

The silicon source chemical, which, in some embodiments, is a silicon halide source chemical (e.g., $SiCl_4$), can be provided with the aid of an inert carrier gas (e.g., $N_2$, He, Ar) or on its own (so-called vapor draw scheme). Due to the size of the species and the number of reactive sites, less than a monolayer (ML) is typically deposited in each pulse of the silicon source chemical. The chemisorbed layer left by the pulse of the silicon source chemical is self-terminated with a surface that is non-reactive with the remaining chemistry of that pulse. This phenomenon is referred to herein as "self-saturation" and the adsorption of silicon reactant is thus self-limiting.

Excess silicon source chemical and reaction by-products (if any) are removed from the reaction space, for example with the aid of a purge gas (e.g., $N_2$, He, Ar) and/or a vacuum generated by a pumping system. If the silicon source chemical is supplied with the aid of a carrier gas, excess silicon source chemical and reaction by-products may be removed by terminating the flow of the silicon source chemical and continuing to supply the carrier gas. In this respect, the carrier gas serves as the purge gas.

In the next phase of the ALD cycle, herein referred to as the "second phase," the metal reactant (i.e., metal source chemical) is provided into the reaction space. The metal source chemical, which, in some embodiments, is a halogen-containing metal source chemical (e.g., $HfCl_4$), can be provided with the aid of an inert carrier gas. The metal source chemical is able to react at unoccupied binding sites on the substrate surface comprising an appropriate functional group. Such binding sites may be available for reaction with the metal source chemical because they are not able to react with the previous silicon source chemical pulse for thermodynamic or kinetic reasons. The amount of metal source chemical that can adsorb on the surface is thus determined at least in part by the number of available and suitable binding sites on the surface and by steric constraints. For example, previously adsorbed silicon halide may sterically prevent the metal reactant from reacting at all possible binding sites.

Again, due to the size of the chemisorbed species and the number of reactive sites, less than a monolayer (ML) is typically deposited in each pulse of the metal source chemical. As with the silicon source chemical, the chemisorbed layer left by the pulse of the metal source chemical is self-terminated with a surface that is non-reactive with the remaining chemistry of that pulse. Thus, the adsorption of metal reactant is also self-limiting. A film with more than one type of metal can be formed by adding additional metal phases.

Excess metal reactant and reaction by-products (if any) are removed from the reaction space. This step may include terminating the pulse of the metal reactant and purging the reaction space with an inert gas (e.g., $N_2$, He, Ar) and/or pumping the reaction space with the aid of a pumping system. If the metal reactant is supplied with the aid of a carrier gas, excess metal reactant and reaction by-products, if any, may be removed by terminating the flow of the metal reactant and continuing to supply the carrier gas.

In the next phase of the ALD cycle, herein referred to as the "third phase" or "oxidizing phase," a pulse of the third reactant, an oxidizing agent, is provided into the reaction space. The oxidizing agent may be introduced on its own or with the aid of a carrier gas. The oxidizing agent reacts with the available metal and/or silicon on the substrate surface to form metal and/or silicon oxide on the substrate surface.

Excess oxidizing agent and reaction by-products, if any, are removed from the reaction space, for example by purging with an inert gas and/or by pumping the reaction space with the aid of a pumping system after stopping the flow of the oxidizing agent.

As mentioned above, it will be appreciated that alternatives to the sequence of steps outlined above are possible. As an example, the cycle may begin with the third phase (provision of the oxidizing agent), or with the second phase (provision of the metal reactant). However, in some embodiments, the metal reactant is the next reactant provided after the silicon reactant. Thus, in some embodiments, a pulsing sequence may include the following sequence of reactant pulses: silicon reactant pulse/metal reactant pulse/oxidizing agent pulse. In other embodiments, the reactant pulses may initiate with an oxidizing agent pulse. As an example, the reactant pulses may include the following sequence of pulses: oxidizing agent pulse/silicon reactant pulse/metal reactant pulse. One of skill in the art will appreciate that because of the cyclical nature of the process, these cycles primarily differ in the first cycle in the ALD process.

In some embodiments, the reactant pulses are separated by a removal step, in which excess reactants and/or reaction by-products (if any) are removed from the reaction space. Removal of excess reactants and/or by-products can occur, for example, with the aid of a purge gas and/or a pumping system, as described above.

It will be appreciated that each of the phases (either in combination with another phase or individually) may be repeated a predetermined number of times prior to the other phases. This can allow control of the stoichiometry of the metal silicate film being formed. For example, if a metal-rich metal silicate film is desired, the second (metal) and third (oxidizing) phase may be repeated several times prior to the silicon oxide phase. On the other hand, if a silicon-rich metal silicate film is desired, the first (silicon) and third (oxidizing) phases can be repeated a number of times prior to continuing with the regular cycle (first through third phases).

In some embodiments, a primary pulsing sequence is oxidizing agent/silicon reactant/metal reactant. This pulsing sequence can be repeated to produce a metal silicate film with a silicon content of about 60 at %.

To increase the silicon concentration further, a secondary reactant pulsing cycle of silicon reactant/oxidizing agent can be repeated one or more times prior to repeating the primary cycle of silicon reactant/metal reactant/oxidizing agent. The secondary pulsing cycle can be repeated any number of times prior to repeating the primary cycle. In some embodiments the secondary cycle is repeated one or more times, five or more times, or some other suitable number of times prior to beginning the primary cycle again. In this way a silicon-rich metal silicate film can be produced with a silicon concentration of greater than 60 at %. In some embodiments the secondary cycle is repeated five times for every primary cycle to produce a silicon-rich metal silicate film with a silicon concentration of above 80 at %. In other embodiments the primary cycle may be repeated multiple times for every secondary cycle.

The skilled artisan will be able to adjust the ratio of the various phases to produce films with stoichiometries suitable for various electronics applications.

A reactant is considered to immediately follow another reactant if only a purge or other reactant removal step intervenes.

In one embodiment, a primary ALD cycle for forming a metal silicate on a substrate comprises:
1. providing a vapor phase pulse of an oxidizing agent to the reaction space, such as, for example, $H_2O$;
2. purging and/or evacuating excess oxidizing agent and reaction by-products from the reaction space;
3. providing a vapor phase pulse of an silicon halide source chemical to the reaction space, such as, for example, $SiCl_4$;
4. purging and/or evacuating excess silicon source chemical and reaction by-products from the reaction space;
5. providing a vapor phase pulse of a metal source chemical to the reaction space, such as, for example, $HfCl_4$; and
6. purging and/or evacuating excess metal source chemical and reaction by-products from the reaction space.

Thus, in one complete primary ALD cycle for depositing a metal silicate on a silicon substrate, formation of the metal silicate film proceeds via formation of an —OH terminated silicon layer on the substrate. However, as $SiCl_4$ is not strongly reactive with —OH terminated surface groups at the deposition temperature, there is limited adsorption of silicon on the substrate during the first silicon halide reactant pulse (3). The metal source chemical provided in the subsequent pulse (5) is able to react with the surface functional groups at unoccupied binding sites and a layer of metal is adsorbed on the substrate.

The cycle is repeated such that the oxidizing agent is provided again (1) and is able to react with the adsorbed metal to form an oxide and, in some embodiments, an OH-terminated metal layer. The silicon halide reactant (2) is able to react with the available binding sites (for example, OH-terminated sites), leaving a surface comprising silicon (halide terminated, not OH-terminated) and some unoccupied surface groups. The metal halide pulse (3) reacts with the available surface groups, but is not able to react with the halide-terminated silicon (which does not have an —OH termination). Finally, the oxidizing agent is able to react with the adsorbed silicon halide and the adsorbed metal halide. The cycle is repeated to form a metal silicate film of desired thickness.

As mentioned above, by adding an additional secondary cycle comprising alternating and sequential provision of silicon halide and water, additional silicon can be incorporated into the growing film. In some embodiments, the secondary cycle is repeated from 1 to 10 or more times for each primary cycle. In some embodiments, the secondary cycle is repeated 5 times for each primary cycle.

The substrate temperature and/or reaction space pressure can be selected to optimize growth of the metal silicate film.

In some embodiments, films are formed at a substrate temperature between about 150° C. and 500° C., between about 250° C. and 350° C., or at another suitable temperature. In some embodiments, the pressure of the reaction space during formation of the metal silicate film is between about 0.1 and 100 Torr, between about 0.5 and 10 Torr, or another suitable pressure.

An exemplary pulsing sequence according to methods of some embodiments is illustrated in FIG. 1. In the illustrated embodiment, the metal silicate film being formed is hafnium silicate. It will be appreciated, however, that these methods can be applied to forming metal silicate films comprising other metals, such as zirconium, in which case the metal source chemical used can be selected as described above.

With reference to FIG. 1, after initial surface termination, if necessary or desired, an oxidizing reactant or source material is supplied 102 into the reaction space comprising the substrate. In the illustrated embodiment, the oxidizing reactant is H2O. The H2O may be provided with the aid of a carrier gas or on its own.

Next, excess oxidizing reactant is removed 104 from the reaction space. Step 104 may entail stopping the flow of the reactant while continuing to flow a carrier gas for a sufficient time to diffuse or purge excess reactants and reaction by-products from the reaction space. For other embodiments, the purge gas is different from the carrier gas. In such a case, the carrier gas serves as the purge gas during the reactant removal step 104. In some embodiments, the removal 104 comprises flowing a purge gas for between about 0.1 seconds and 20 seconds after stopping the flow of the metal reactant pulse. Inter-pulse purging is described, for example, in U.S. Pat. No. 6,511,539, filed Sep. 8, 1999, entitled, "Apparatus and Method for Growth of a Thin Film," the entire disclosure of which is incorporated herein by reference. In some arrangements, the reaction space may be pumped down between alternating chemistries. See, for example, PCT publication number WO 96/17107, published Jun. 6, 1996, entitled "Method and Apparatus for Growing Thin Films," the entire disclosure of which is incorporated herein by reference. Thus, the removal step 104 may entail simultaneously purging and pumping the reaction space. Together, the provision 102 and removal 104 of H2O represent a first phase 120 of the illustrated ALD cycle.

Next, $SiCl_4$ is pulsed 106 to the substrate. After a time period sufficient to react with the surface (if the appropriate termination is present), the $SiCl_4$ pulse is terminated and excess reactant and any reaction by-products are removed 108 from the reaction space, for example, with the aid of a purge gas pulse and/or a vacuum generated by a pumping system. The removal step 108 may be as described for step 104 above. Together, steps 106 and 108 represent a second phase 130 of the illustrated ALD process.

Next, $HfCl_4$ is supplied 110 to the substrate. In accordance with some embodiments, the $HfCl_4$ pulse 110 is the next reactant pulse following the $SiCl_4$ pulse 106. The $HfCl_4$ reactant pulse 110 reacts with any available binding sites and leaves no more than a monolayer of a hafnium-containing film on the substrate.

Excess hafnium reactant and reaction by-products, if any, are removed 112 from the reaction space. As with removal step 104 above, step 112 can include stopping the flow of the third chemistry ($HfCl_4$) and continuing to flow carrier gas for a time period sufficient to remove excess reactants and any reaction by-products from the reaction space. Together, the hafnium reactant pulse 110 and removal step 112 represent a third phase 140 of the illustrated ALD process.

The first phase 120, second phase 130 and third phase 140 are repeated 160 until a hafnium silicate film of desired thickness is formed on the substrate. For example, the three phases may be repeated 10 times, 100 times, 1000 times or more to form a compositionally uniform hafnium silicate film.

In another alternative embodiment (not shown), the ALD sequence illustrated in FIG. 1 begins with the second phase 130 and is sequentially followed by the third phase 140 and the first phase 120. In such a case, the sequence of steps includes: silicon source chemical pulse/reactant removal/metal source chemical pulse/reactant removal/oxidizing species pulse/reactant removal. This sequence may be repeated until a hafnium silicate film of desired thickness is formed on the substrate. As a particular example, a hafnium silicate film may be formed by an ALD cycle comprising the following vapor phase pulsing sequence: $SiCl_4$/inert gas/$HfCl_4$/inert gas/$H_2O$/inert gas.

In another alternative embodiment (not shown), the ALD sequence illustrated in FIG. 1 begins with the first phase 120 and is sequentially followed by a phase that includes at least some portions of the second phase 130 and the third phase 140. For example, after removal of excess oxidizing agent (104), silicon source chemical and metal source chemical can be introduced simultaneously. Excess silicon source chemical, metal source chemical, and reaction byproducts can subsequently be removed from the reaction space. As a particular example, a hafnium silicate film may be formed by an ALD cycle including the following vapor phase pulsing sequence: $H_2O$/inert gas/$SiCl_4$ and $HfCl_4$/inert gas.

Metal silicate films formed according to some methods have thicknesses between about 0.5 and 40 nm, between about 1 and 15 nm, or other suitable thicknesses. It will be understood that thicknesses can vary with application. For example, in gate dielectrics for CMOS devices, the metal silicate films can have thicknesses between about 1 and 5 nm. As another example, in DRAM devices, the metal silicate films can have thicknesses between about 3 and 15 nm. The skilled artisan will be able to select an appropriate thickness for a particular application.

Thus, according to the foregoing embodiments, a metal silicate film is formed on a substrate. Depending on their desired use, metal silicate films are formed having dielectric constants, for example, between about 4 and 50, between about 8 and 30, or other suitable dielectric constants. Metal silicate films formed according to methods described herein can have halogen (e.g., chlorine) impurity concentrations less than or equal to about 20,000 parts-per-million (ppm), less than or equal to about 10,000 ppm, less than or equal to about 5,000 ppm, or less than or equal to about 2,000 ppm.

In addition, metal silicate films formed according to methods described herein can have "within wafer" (WIW) uniformities (1 sigma) of less than about 1% on surfaces. In some embodiments, leakage current densities are less than or equal to about $1 \times 10^{-3}$ A/cm$^2$ at an effective oxide thickness (EOT) of about 1.5 nm, less than or equal to about $1 \times 10^{-4}$ A/cm$^2$ at an EOT of about 1.5 nm, or less than or equal to about $1 \times 10^{-5}$ A/cm2 at an EOT of about 1.5 nm. Metal silicate films formed according to methods described herein can have metal and silicon concentrations between about 10% metal/90% Si to about 90% metal/10% Si.

The aforesaid embodiments will be further illustrated in the context of an example, which is not intended to limit the scope of the invention.

Example 1

A hafnium silicate film was deposited on a 300 mm silicon wafer using a Pulsar™ reactor manufactured by ASM America, Inc. Deposition was conducted at a substrate temperature in the range of about 300 to 350'C. The sequence processing steps included the following:

(1) $H_2O$ pulse;
(2) $N_2$ purge;
(3) $SiCl_4$ pulse;
(4) $N_2$ purge;
(5) $HfCl_4$ pulse; and
(6) $N_2$ purge.

Steps (1)-(6) were repeated until a hafnium silicate film with a thickness of about 40 Å was formed on the silicon wafer.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. An atomic layer deposition (ALD) method for forming a metal silicate film on a substrate in a reaction space, comprising:
    a first deposition cycle comprising:
        contacting the substrate with a vapor phase pulse of an oxidizing agent;
        removing excess oxidizing agent from the reaction space;
        contacting the substrate with a vapor phase pulse of a metal halide, wherein the metal comprises hafnium and/or zirconium; and
        removing excess metal halide from the reaction space; and
    a second deposition cycle comprising:
        contacting the substrate with a vapor phase pulse of an oxidizing agent;
        removing excess oxidizing agent from the reaction space;
        contacting the substrate with a vapor phase pulse of a silicon halide; and
        removing excess silicon halide from the reaction space;
    wherein the first and second deposition cycles are repeated according to a predetermined ratio to achieve a metal-rich metal silicate film.

2. The method of claim 1, wherein the first and second deposition cycles together comprise a metal silicate deposition cycle.

3. The method of claim 2, further comprising repeating the metal silicate deposition cycle until a film of a desired thickness is achieved.

4. The method of claim 1, wherein the oxidizing agent comprises an agent selected from the group consisting of isopropyl alcohol, methanol, ethanol, a small molecular weight alcohol, NO, $N_2O$, $N_2O_5$, oxygen-containing radicals, $H_2O$, $H_2O_2$, $O_2$, $O_3$, $D_2O$, and $D_2O_2$.

5. The method of claim 1, wherein the oxidizing agent comprises water.

6. The method of claim 1, wherein the metal halide is $HfCl_4$.

7. The method of claim 1, wherein the silicon halide is $SiCl_4$.

8. The method of claim 1, wherein a ratio between the number of first and second deposition cycles is selected to deposit a metal silicate film with a desired composition.

9. The method claim 1, wherein the silicon halide comprises $SiF_4$, $SiCl_4$, $SiBr_4$, $SiI_4$, or combinations thereof.

10. The method of claim 1, wherein the metal silicate film is formed at a substrate temperature of about 150° C. to about 500° C.

11. The method of claim 1, wherein the metal silicate film is formed at a substrate temperature of about 200° C. to about 450° C.

12. The method of claim 1, wherein the metal silicate film is used in a dynamic random access memory (DRAM) device.

13. The method of claim 1, wherein the metal silicate film is used as a gate dielectric in a complementary metal oxide semiconductor (CMOS) device.

14. The method of claim 1, further comprising providing an initial surface termination on the substrate prior to contacting the substrate.

15. An atomic layer deposition (ALD) method for forming a silicon-rich metal silicate film, the method comprising a plurality of cycles, each cycle comprising contacting a substrate in a reaction space with spatially and temporally separated vapor phase pulses of a silicon halide source chemical, a metal source chemical, and an oxidizing agent, wherein the metal source chemical is the next reactant provided after the silicon halide source chemical.

* * * * *